United States Patent [19]
Liu et al.

[11] Patent Number: 6,005,277
[45] Date of Patent: Dec. 21, 1999

[54] ARC LAYER ENHANCEMENT FOR REDUCING METAL LOSS DURING VIA ETCH

[75] Inventors: Chwen-Ming Liu, Chai-Yi; Jiann-Jong Wang, Tao-Yuan; Chung-Chieh Liu, Shin-Chu, all of Taiwan

[73] Assignee: Taiwan Semiconductor Manufacturing Company, Ltd., Hsin-Chu, Taiwan

[21] Appl. No.: 09/157,512

[22] Filed: Sep. 21, 1998

Related U.S. Application Data

[62] Division of application No. 08/679,911, Jul. 15, 1996.

[51] Int. Cl.$^6$ ................ H01L 31/0232; H01L 23/48; H01L 23/52; H01L 29/40
[52] U.S. Cl. .................... 257/437; 257/773; 257/763; 257/764
[58] Field of Search ..................... 257/773, 763, 257/764, 437, 758

[56] References Cited

U.S. PATENT DOCUMENTS

| | | | |
|---|---|---|---|
| 5,258,096 | 11/1993 | Sandhu et al. | 156/643 |
| 5,395,795 | 3/1995 | Hong et al. | 437/190 |
| 5,462,895 | 10/1995 | Chen | 437/200 |
| 5,847,459 | 12/1998 | Taniguchi | 257/751 |
| 5,869,902 | 2/1999 | Lee et al. | 257/773 |

*Primary Examiner*—Mahshid Saadat
*Assistant Examiner*—Jesse A. Fenty
*Attorney, Agent, or Firm*—George O. Saile; Stephen B. Ackerman

[57] ABSTRACT

A method for forming an anti-reflective-coating(ARC) layer is described. This ARC layer performs not only in its capacity to reduce reflections from its subjacent metal layer during the metal patterning photoresist exposure, but also serves as an effective etch inhibitor during subsequent via etching. Of particular importance is the ability provided by this ARC layer to sustain its etch resistance during considerable over etching such as is required when vias of different depths are to be opened. The ARC layer differs from the conventional titanium nitride ARC layer in that it has a base layer of titanium below the titanium nitride portion. It is this titanium layer and an optional intermediate Ti rich layer that sustains the over etch. Additionally, the titanium forms an improved bonding with the metal beneath providing reduced via contact resistance and greater via stability and consistency.

1 Claim, 5 Drawing Sheets

ARC LAYER ENHANCEMENT FOR REDUCING METAL LOSS DURING VIA ETCH

RELATED PATENT APPLICATION

This is a division of patent application Ser. No. 08/679,911, filing date Jul. 15, 1996, An Arc Layer Enhancement For Reducing Metal Loss During Via Etch, assigned to the same assignee as the present invention.

BACKGROUND OF THE INVENTION (1) Field of the Invention

The invention relates to processes for the manufacture of semiconductor devices and more particularly to processes for forming vias.

(2) Description of Prior Art

The fabrication of integrated circuit chips comprises the formation of semiconductor devices within the surface of a single crystalline silicon wafer, covering these devices with an insulative layer and forming contacts to the devices through openings in the insulative layer. These contacts are then further connected by a layer of patterned metallization which forms the wiring of basic circuits. Alternate levels of insulators and metallization connect the basic circuits to form a hierarchy of integrated circuit wiring which is finally brought to the external terminations of the chip.

A common practice is the use of conductive tungsten studs within the first insulating layer defining the contacts. These studs are connected to a first metallization level of an aluminum-copper(Al/Cu) alloy. An insulating layer is then formed over the patterned metallization, and openings are etched to allow the wiring pattern of a second metallization layer, also comprising an Al/Cu alloy, to connect to the wiring of the first. The second metal layer is deposited over the insulating layer and into the openings. Patterning and etching of the second metal layer completes the construction of the two interconnected wiring layers. The connections made by the second metal to the first metal through the openings in the insulator are generally referred to as vias.

Patterning of layers of all kinds is accomplished by etching away portions of a deposited layer leaving the desired wiring pattern in place. This selective removal always results in a non-planar surface. If steps were not taken to remove this non-planarity, the cumulative effect of patterning would quickly result in an unacceptable topography for proper metal coverage. Since the metal layers are deposited by non-conformal physical-vapor-deposition (PVD) techniques such as vacuum evaporation or sputtering, the general procedure is to planarize the insulator surface, at least locally, prior to the deposition of the next metal layer.

The configuration addressed by this invention is illustrated by FIG. 1. Shown here is a silicon wafer substrate 10 with semiconductor devices formed within its surface. The layer 14 represents a plurality of structural components layered beneath a metal layer 16. These comprise polysilicon levels which form components of MOS field-effect-transistors and their local interconnects. The figure illustrates two regions of interest on the wafer. In the left hand portion, the metal 16 lies over a region containing field oxide(FOX) 12 while in the right hand portion, the FOX layer is absent. The spaces 30 represents the patterning of the metal layer. Atop the metal layer 16 is a layer of titanium nitride 18 which is applied to provide an anti-reflective-coating(ARC) over the metal layer 16. This coating serves to eliminate reflections from the metal surface during exposure of the patterning photoresist.

An insulative layer 20 is deposited over the patterned metal layer 16. This layer, referred to as an inter-metal dielectric(IMD) layer, is deposited thicker than required and is subsequently planarized by any of several commonly known techniques. For this illustration, chemical-mechanical-polishing(CMP) may be used. This method provides a global planarization of the wafer surface. After planarization, the IMD is thinner over the section which lies over the field oxide 12.

Photoresist 22 is applied and patterned to define vias 32 and 34 for the connections to the next metal level. The vias are etched by reactive-ion-etching(RIE) exposing the TiN ARC layer.

The ARC layer 18 could provide an effective etch stop providing the etch-rate selectivity for the silicon oxide IMD dielectric 20 over the TiN were great enough. However, this is not the case. Consequently, in order to complete the opening of the deep via 34, the shallow via 32 must be over etched to such an extent that the ARC layer is penetrated and a portion of the Al/Cu metal layer is lost.

Since a greater selectivity cannot be obtained, one approach to this problem would be to make the TiN layer 18 thicker so that the over-etch of the shallow via 32 required to open the deep via 34 terminates within the TiN layer. However, since the resistivity of TiN is over an order of magnitude greater than that of the AlCu alloy, the $R_c$ of the via would be adversely affected.

An additional consequence of Al/Cu penetration in the shallow via 32 is a deterioration of metal edge coverage by the deposited via metal. However, this shortcoming is also experienced in the deep via 34.

Sandhu et.al. U.S. Pat. No. 5,258,096 describe the usage of etch stop layers for forming contacts and vias of varying depths. They mention the use of several materials including doped polysilicon, Ti, and TiN. In their invention they use a doped polysilicon layer which is deposited solely to be locally formed into etch stops for contact access openings in a DRAM array structure and its periphery. Their process requires a separate deposition step to form the doped polysilicon layer which makes direct contact to the device active regions. The modification ARC layers to be used as etch stops is not suggested.

Chen U.S. Pat. No. 5,462,895 forms a layer of varying composition, beginning as a Ti enriched layer of TiN which is continuously blended into a stoichiometric TiN layer. A continuous chemical-vapor-deposition(CVD) process is used for the deposition. This layer performs as an adhesive layer between a silicon contact and a tungsten plug. The Ti rich portion forms a $TiSi_x$ bond with the silicon in the contact. The layer is not called upon to block a subsequent etch.

SUMMARY OF THE INVENTION

It is an object of this invention to eliminate AL/Cu loss resulting from ARC layer penetration by silicon oxide RIE etchant gases during the etching of via openings.

It is a further object of this invention to form an ARC layer which, when incorporated as part of a via, will provide a stable low resistance ohmic contact to the subjacent metal wiring.

These objects are accomplished by improving the etchant resistance of the ARC layer to silicon oxide etchants by forming the layer as a composite having a base portion of Ti and an upper portion of TiN. The etch rate of Ti is much less than that of TiN in the etchant used for the Via RIE. Thus, by providing a sufficiently thick Ti layer under the TiN ARC coating, the selectivity of the IMD layer to the composite ARC layer can be significantly increased.

The composite ARC layer is formed by first sputtering a titanium target in pure argon to give a titanium base to the ARC layer. Next, nitrogen is added to the sputtering gas to form the TiN upper portion.

This composite ARC layer not only provides a higher etch rate selectivity (SiO2 over ARC layer) but also yields improved bonding with the Al/Cu. Whereas the selectivity of IMD to TiN is about 10:1 that of IMD to the titanium-rich ARC layer is between 15:1 and 20:1.

The Ti lower portion of the ARC layer forms an improved chemical bond with the subjacent metal thereby further reducing AlCu loss during via etch and improving the stability and controllability of the contact.

These objects are accomplished with minimal and virtually negligible increase in process complexity or cost.

DESCRIPTION OF THE PREFERRED EMBODIMENTS

Figure 1:
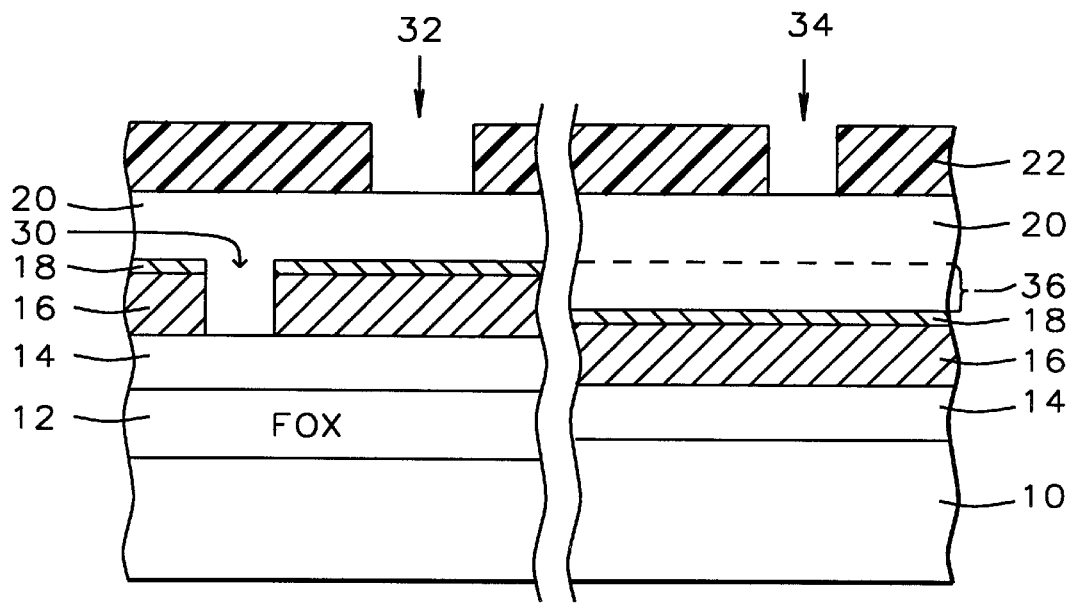
FIG. 1 is a cross sectional view of a wafer illustrating shallow and deep vias.
Figure 2A:
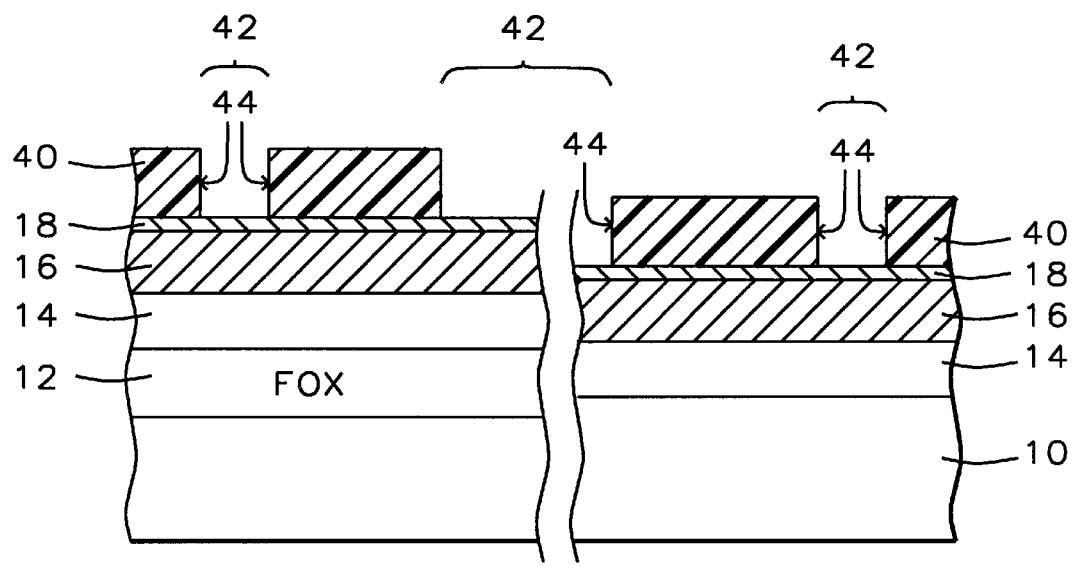
FIG. 2A through FIG. 2C are cross sections showing the process steps of the embodiment of this invention.
Figure 3:
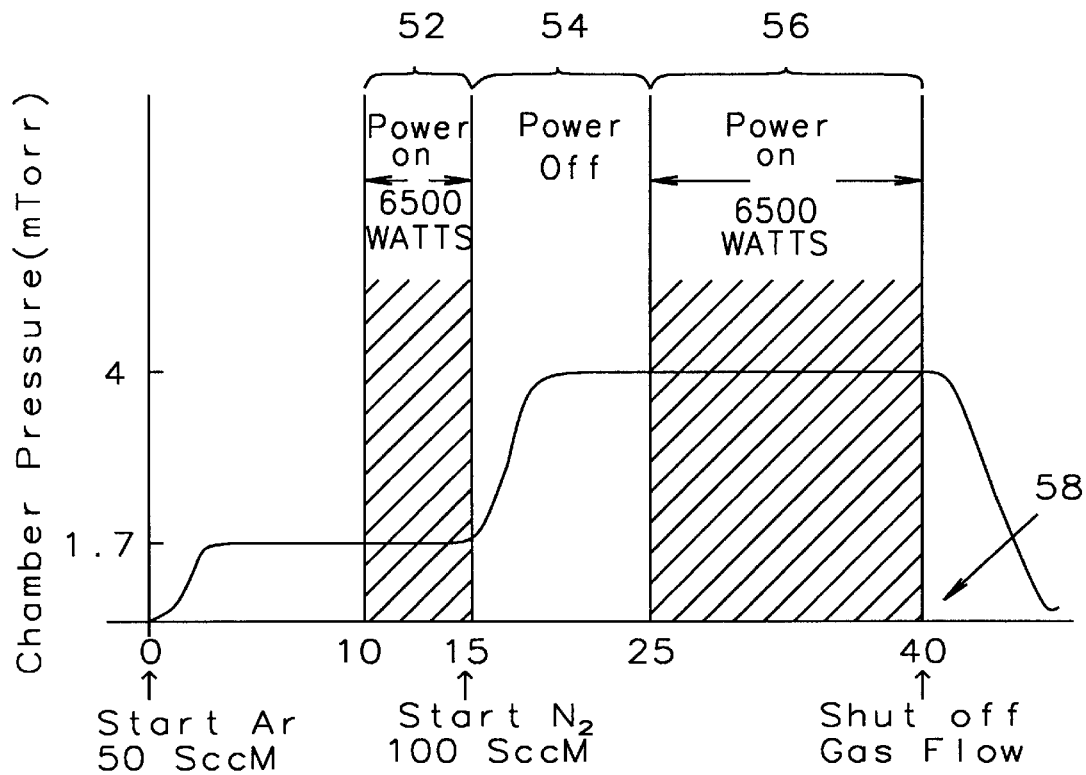
FIG. 3 is a graph of chamber pressure vs. time and showing the sequence of steps for forming the ARC layer according to the first embodiment of this invention.

Accordingly, in a first embodiment of this invention a p-type monocrystalline silicon wafer substrate is provided. Referring first to FIG. 2A, the wafer 10 is processed using prior art procedures, to the point where a metal layer has been deposited over an insulator layer on the wafer. The layers shown in FIG. 2A through 2C correspond to those of the same numerical designation shown in FIG. 1. A field oxide layer 12 in one area of the wafer 10 and its absence in another area will again be used to illustrate the effect of vias having different depths. The layer 14 represents a plurality of intermediate layers which have been deposited prior to the metal layer 16. An ARC layer 18 is next deposited over the metal layer by dc sputtering of a titanium target according to the following procedure:

The wafer is placed into the chamber of a dc sputtering tool containing a pure titanium target and the chamber is evacuated to a pressure of less than 1 microTorr. Referring next to FIG. 3, there is shown a chart of sputtering chamber pressure vs. time to illustrate the operational procedure used for the deposition of the ARC layer. Time zero occurs when the chamber has stabilized at a background pressure of 1 microTorr. Argon is admitted to the sputtering chamber at a flow rate of 50 SCCM(Standard cubic centimeters per minute). For the pumping capacity of the tool used in this embodiment, this corresponds to a chamber pressure of 1.7 milliTorr.

When the pressure has stabilized(about 10 sec.), dc power of 6500 watts is applied to the titanium sputtering target for a period 52 of 1 to 5 seconds. This corresponds to a power density of about 8 Watts per $cm^2$ of target area. Power is removed during the period 54 during which nitrogen flow is begun at a rate of 100 SCCM. Again, after allowing the chamber pressure about 10 seconds to stabilize at 4 milliTorr, dc power of 6500 Watts is again applied for a period 56 of 14 seconds. The dc power shut off and the gas flow is halted. The chamber is then returned to high vacuum.

After completion of the sputtering process, the wafer is removed from the sputtering tool and, referring again to FIG. 2A, the processing proceeds with the deposition of a photoresist layer 40 which defines the wiring pattern for the metal layer. The exposure of this layer of photoresist 40 is benefited by the presence of the ARC layer in that refections of the exposing radiation are abated by the surface of the ARC layer, thereby preventing unwanted exposure along the edges 44 of the exposed openings 42. The patterned photoresist is used as a mask to reactive-ion-etch(RIE) the pattern into the ARC layer 18 and the metal layer 16. After the RIE step, the photoresist mask is removed by standard photolithographic method such as by ashing or solvents.

Figure 2B:
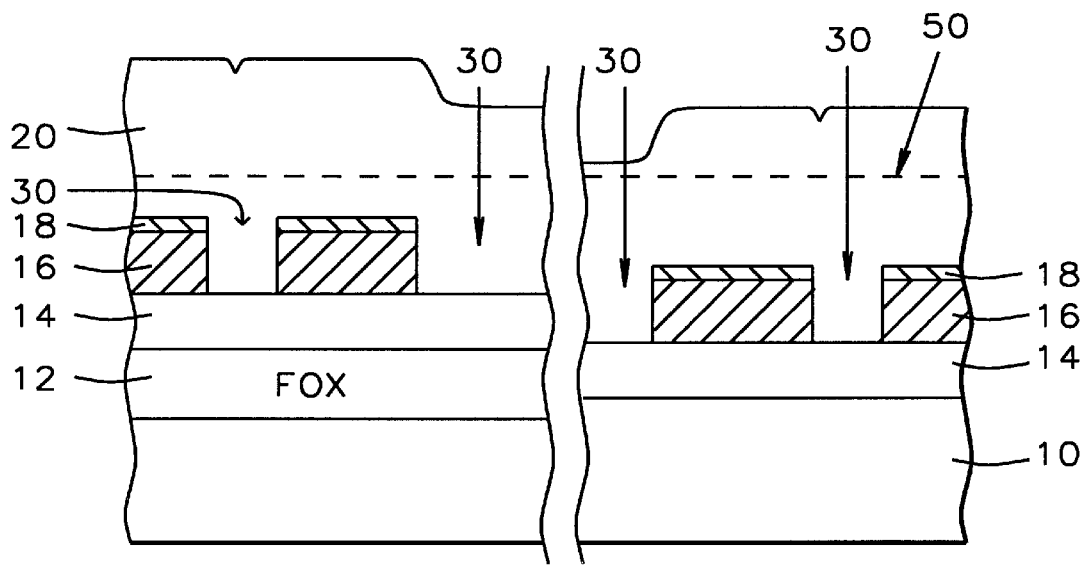

Referring next to FIG. 2B, the openings 30 represent the open areas of the first metallization layer. A thick insulating layer of silicon oxide 20 is then deposited by plasma-enhanced-chemical-vapor-deposition(PECVD) or by low-pressure-chemical-vapor-deposition(LPCVD). This layer 20 is deposited much thicker than required as an IMD, so that it can be planarized in preparation for the next level of metallization. The upper surface of this layer as shown in FIG. 2B, reflects non-planarities which have been propagated from sundry topographic features beneath. Using CMP, the upper portion of the IMD layer 20 is polished away to the dashed line 50 shown in FIG. 2B.

Figure 2C:
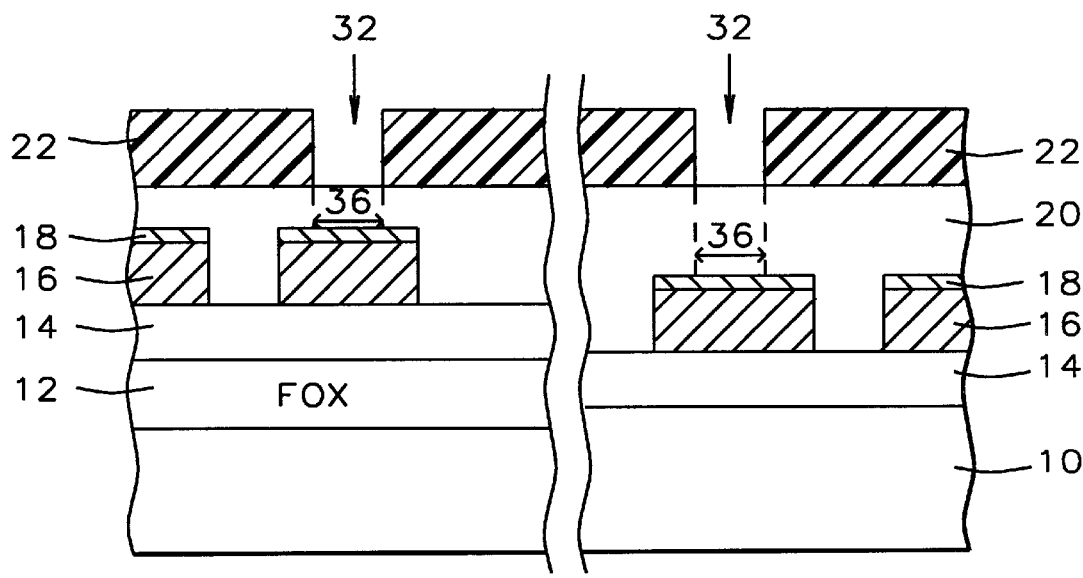

Referring now to FIG. 2C, a layer of photoresist 22, which defines the via openings for the next level of metal, is deposited and patterned. This layer, also shown in FIG. 1 contains openings for shallow vias 32 and deep vias 34. The areas to be opened by the via etch are shown by the dashed lines 36 in the IMD below openings 32 and 34.

RIE of the IMD layer 20 now proceeds completing the shallow via 32 first. The reactant gas used for the RIE is $CF_4$ and $CHF_3$ in Argon.

Not only does the Ti rich portion of the ARC layer base bolster the durability of the ARC layer as an etch stop but the recipe for its formation provides a decisive improvement to the electrical properties of the via contact itself. An excessive thickness of TiN is not required to take up the over-etch, so the series resistance of the ARC layer in the deep via 34 is not compromised. The titanium base of the ARC layer forms a stronger and more stable chemical bond with the underlying Al/Cu metallurgy, thereby resulting in better $R_c$/via control.

When the freshly etched vias openings are exposed to atmosphere, a native oxide film forms over the exposed metal surfaces. This film is removed immediately prior to the subsequent metal deposition by an argon plasma etch.

Figure 4:
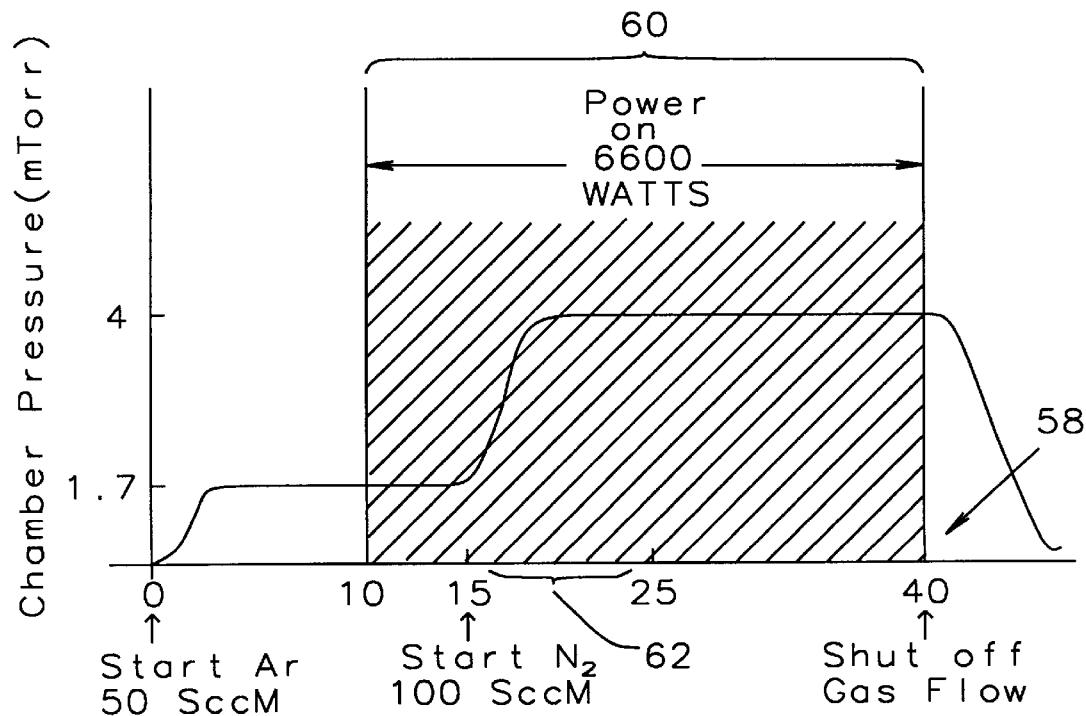
FIG. 4 is a graph of chamber pressure vs. time and showing the sequence of steps for forming the ARC layer according to the second embodiment of this invention.

In another embodiment of this invention, the process of the first embodiment is followed up to the point where the wafer is inserted into the sputtering chamber for the deposition of the ARC layer. Instead of the regimen illustrated in FIG. 3, where the dc power to the sputtering target is interrupted between the Ti deposition and the TiN deposition 54 the regimen shown in FIG. 4 is employed. The dc sputtering power is applied continuously over the period 60. This period encompasses the entire interval between the gas equilibration at 10 seconds and the end of the deposition 58.

During the transition period 62 where the nitrogen flow is introduced, a transition layer is deposited starting in composition as pure Ti and gradually blended into stoichiometric TiN at the end of the period 62. The remainder of the period 60 forms the final TiN portion as in the first embodiment. The processing is then continued as in the first embodiment proceeding with the photoresist 40 deposition shown in FIG. 2A.

Figure 5A:
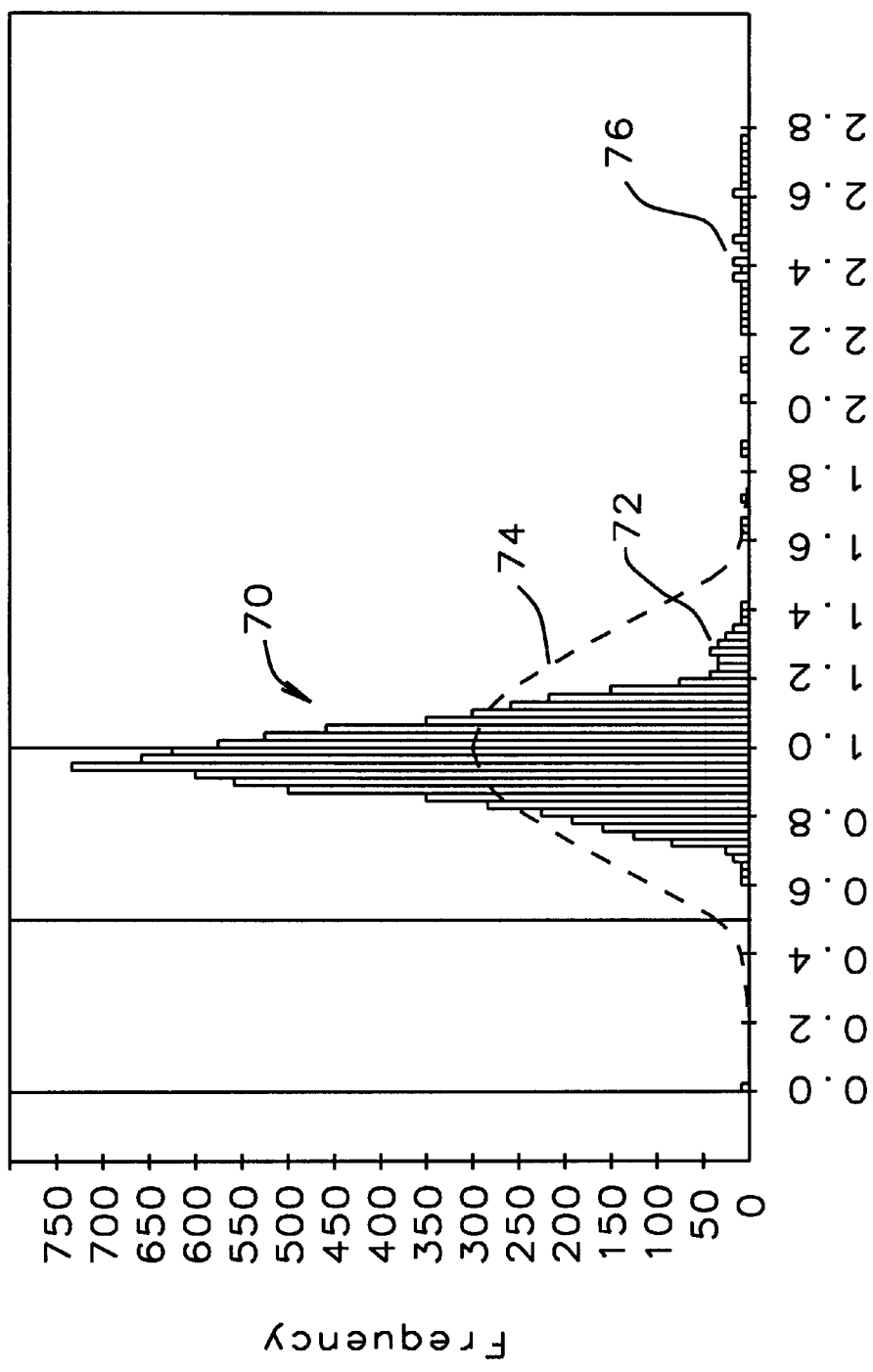
FIG. 5A and FIG. 5B are plots showing the distribution of via $R_c$ in product before and after incorporation of the method of this invention.
Figure 5B:
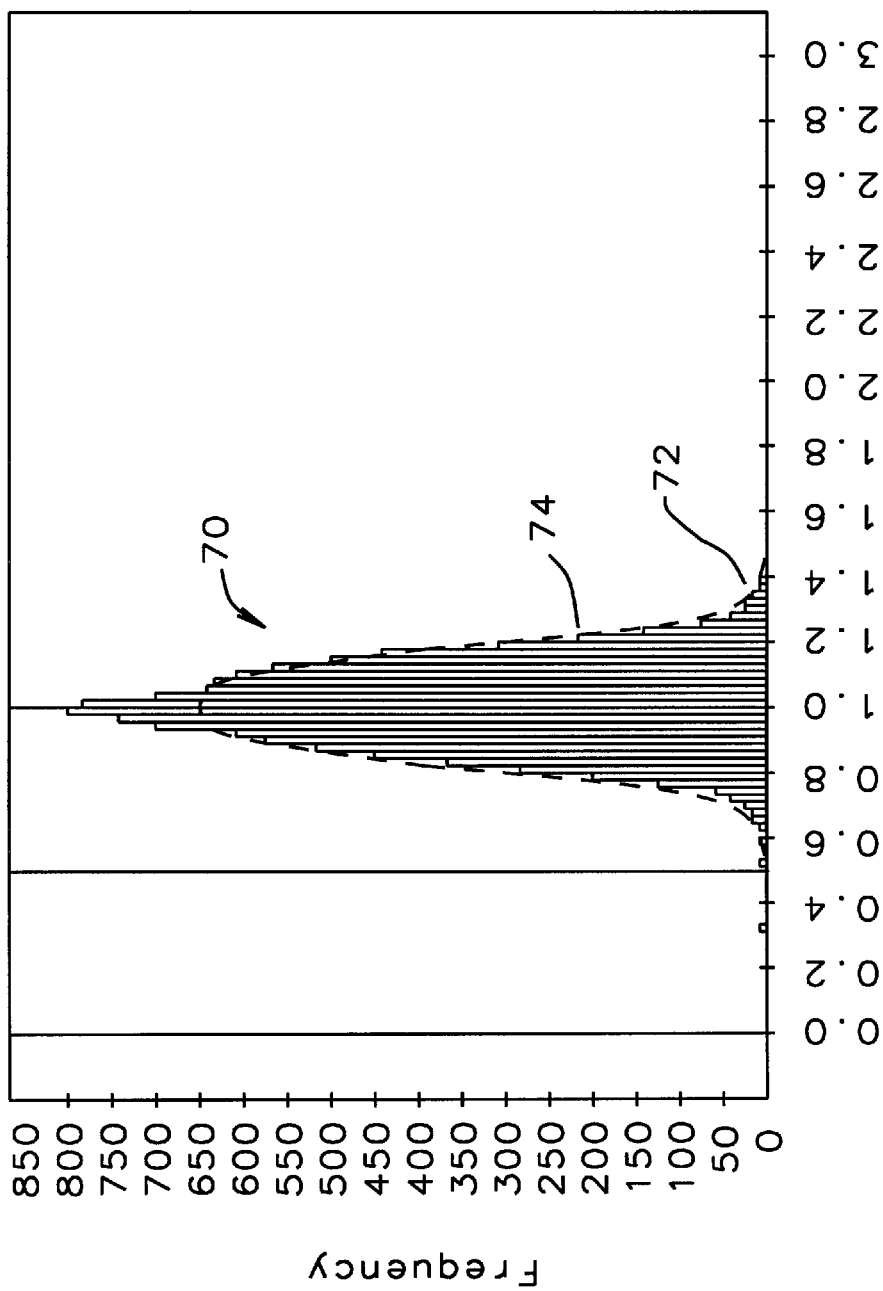

The improvement of the electrical characteristics of the vias is demonstrated in the distribution charts shown in FIG. 5A and FIG. 5B. Here the contact resistance of a deep via is shown before (FIG. 5A) and after (FIG. 5B) the incorporation of the improved ARC layer into a manufacturing process.

The distribution body 60 shown in FIG. 5A was constructed from data on 9580 measurements of vias produced before the novel ARC layer of this invention was incorporated into the manufacturing process. The data shown here contains multiple high resistivity flyers 66 which are not members of the main body of the distribution. The main body 60 itself has a high-end-tail 62 which could be attributed to second mechanism causing high resistivity vias. The broad the normal curve 64 generated from the mean and standard deviation of the data, reflects contribution of the high resistivity components in the tail 62 and the flyers 66.

Referring now to FIG. 5B there is shown the distribution of the resistivities of 8185 vias formed using the ARC layer described by this invention. The high resistance flyers have disappeared and the high resistivity tail 62 is barely discernible. The main body of the distribution 60 is now much tighter and the normal curve generated from the statistical data matches the shape of the body 60 to an extraordinary degree indicating only random process variations. The decrease of the standard deviation from 0.2553 to 0.09888 is testimony to the benefits realized by this invention.

The embodiment uses a p-type substrate. It should be well understood by those skilled in the art that n-type substrate conductivities may also be used. It should be further understood that the substrate conductivity type as referred to here does not necessarily refer to the conductivity of the starting wafer but could also be the conductivity of a diffused region within a wafer wherein the semiconductor devices are incorporated.

While the invention has been particularly shown and described with reference to the preferred embodiments thereof, it will be understood by those skilled in the art that various changes in form and details may be made without departing from the spirit and scope of the invention.

What is claimed is:

1. A combination anti-reflection-coating and etch stop layer comprising:

a layer of Ti deposited onto a substrate with a metal layer which is to be patterned; and a graded layer deposited over said layer of Ti, said graded layer having a composition of pure Ti proximal to said Ti layer and, with increasing thickness, becoming distally gradually reduced in Ti content with an accompanying increase in nitrogen content, blending smoothly into a final portion of stoichiometric TiN.

* * * * *

UNITED STATES PATENT AND TRADEMARK OFFICE
CERTIFICATE OF CORRECTION

PATENT NO. : 6,005,277
DATED : 12/21/99
INVENTOR(S) : Chwen-Ming Liu, Jiann-Johg Jang, Chung-Chieh Liu It is certified that error appears in the above-identified patent and that said Letters Patent is hereby corrected as shown below:

On the Cover Page, at (75), delete "Shin-Chu", and replace with --Hsin-Chu--.

Signed and Sealed this

Twenty-seventh Day of March, 2001

Attest:

NICHOLAS P. GODICI

Attesting Officer

Acting Director of the United States Patent and Trademark Office